United States Patent
Chambers et al.

(10) Patent No.: US 6,828,200 B2
(45) Date of Patent: Dec. 7, 2004

(54) MULTISTAGE DEPOSITION THAT INCORPORATES NITROGEN VIA AN INTERMEDIATE STEP

(75) Inventors: James Joseph Chambers, Dallas, TX (US); Mark Visokay, Richardson, TX (US); Luigi Colombo, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/336,441

(22) Filed: Jan. 3, 2003

(65) Prior Publication Data

US 2004/0132315 A1 Jul. 8, 2004

(51) Int. Cl.[7] .................... H01L 21/336; H01L 21/31; H01L 29/76; H01L 31/119
(52) U.S. Cl. .................... 438/287; 438/785; 438/786; 257/310; 257/410; 257/411
(58) Field of Search ................ 438/287, 785, 438/761, 763, 765

(56) References Cited

U.S. PATENT DOCUMENTS

| | | | |
|---|---|---|---|
| 6,013,553 A | * | 1/2000 | Wallace et al. ............. 438/287 |
| 6,124,620 A | | 9/2000 | Gardner et al. |
| 6,207,589 B1 | * | 3/2001 | Ma et al. .................... 438/785 |
| 6,504,214 B1 | * | 1/2003 | Yu et al. ..................... 257/347 |
| 6,559,014 B1 | * | 5/2003 | Jeon ........................... 438/287 |

OTHER PUBLICATIONS

Hendrix et al., "Composition control of Hf$_{1-x}$Si$_x$O$_2$ films deposited on Si by chemical–vapor deposition using amide precursors"; Applied Physics Letters, vol. 80, Issue 13, pp. 2362–2364 (2002).*

* cited by examiner

Primary Examiner—John F. Niebling
Assistant Examiner—Ron Pompey
(74) Attorney, Agent, or Firm—Peter K. McLarty; W. James Brady, III; Frederick J. Telecky, Jr.

(57) ABSTRACT

The present invention forms a nitrided dielectric layer without substantial harm to a semiconductor layer on which the dielectric layer is formed. The invention employs a multi-stage process in which dielectric sub-layers are individually nitrided before formation of a next dielectric sub-layer. The net result is a nitrided multi-layered dielectric layer comprised of a plurality of dielectric sub-layers wherein the sub-layers have been individually deposited and incorporated with nitrogen.

14 Claims, 10 Drawing Sheets

MULTISTAGE DEPOSITION THAT INCORPORATES NITROGEN VIA AN INTERMEDIATE STEP

FIELD OF THE INVENTION

The present invention relates generally to the field of semiconductor fabrication, and more particularly, relates to systems and methods that facilitate control and fabrication of nitrogen containing dielectric layers.

BACKGROUND OF THE INVENTION

Semiconductor devices continue to be reduced in dimensions while maintaining or increasing in performance in response to an ever-increasing demand. This increasing demand is likely to continue and requires improvements in semiconductor fabrication processes and structures. Improvements in semiconductor processes permit fabrication of semiconductor devices in smaller dimensions and in higher density, quantity, and reliability. Improvements in semiconductor structures typically yield greater circuit performance, power control, and reliability.

Semiconductor devices are comprised of a number of materials, components, structures, and layers. One type of layer employed in semiconductor devices is a dielectric layer, which is comprised of dielectric material. Dielectric materials, also referred to as dielectrics, exhibit a large attractive force between the nucleus and orbiting electrons and have a net effect of a large amount of resistance to the movement of electrons. Dielectrics have low conductivity and high resistivity in contrast to conductive materials that have a high conductivity and low resistivity. Additionally, dielectrics can be divided into low-k dielectrics, which have a relatively low capacitance and resistance (but still higher than that of a conductive material), and high-k dielectrics, which have a relatively high capacitance, resistance and low conductance. The "k" refers to the dielectric constant of particular dielectric materials. Dielectrics, particularly high-k dielectrics, are often utilized in capacitor and capacitor like structures in semiconductor devices. Such structures are formed whenever a dielectric layer is formed between two conductors. For example, capacitor structures are formed in MOS gate structures by forming a dielectric layer between metal or polysilicon layers and silicon substrates.

As dielectric layers become thinner, leakage current and diffusion of materials (e.g., boron) become problematic. Nitridation of these dielectric layers can mitigate some of the problems. However, incorporation of nitrogen into dielectric layers, particularly high-k dielectrics that comprise dielectric compounds, can be difficult and can introduce additional problems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention incorporates nitrogen into a dielectric compound as part of a deposition process without substantially harming an underlying semiconductor layer (e.g., silicon). The present invention incorporates nitrogen, controllably and/or uniformly, into a high-k dielectric layer. The incorporated nitrogen can reduce undesired crystallization, leakage current, diffusion and the like.

A dielectric layer in accordance with the present invention is a composite of a number of sub-layers, which are respectively formed via a two stage process. First, a sub-layer, comprised of a dielectric compound such as HfSiO, is formed via a suitable deposition technique (e.g., chemical vapor deposition) and secondly, the sub-layer is nitrided by a nitridation procedure. As a result, the sub-layer comprises nitrogen (e.g., HfSiON). The remaining sub-layers are similarly formed and collectively comprise the dielectric layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
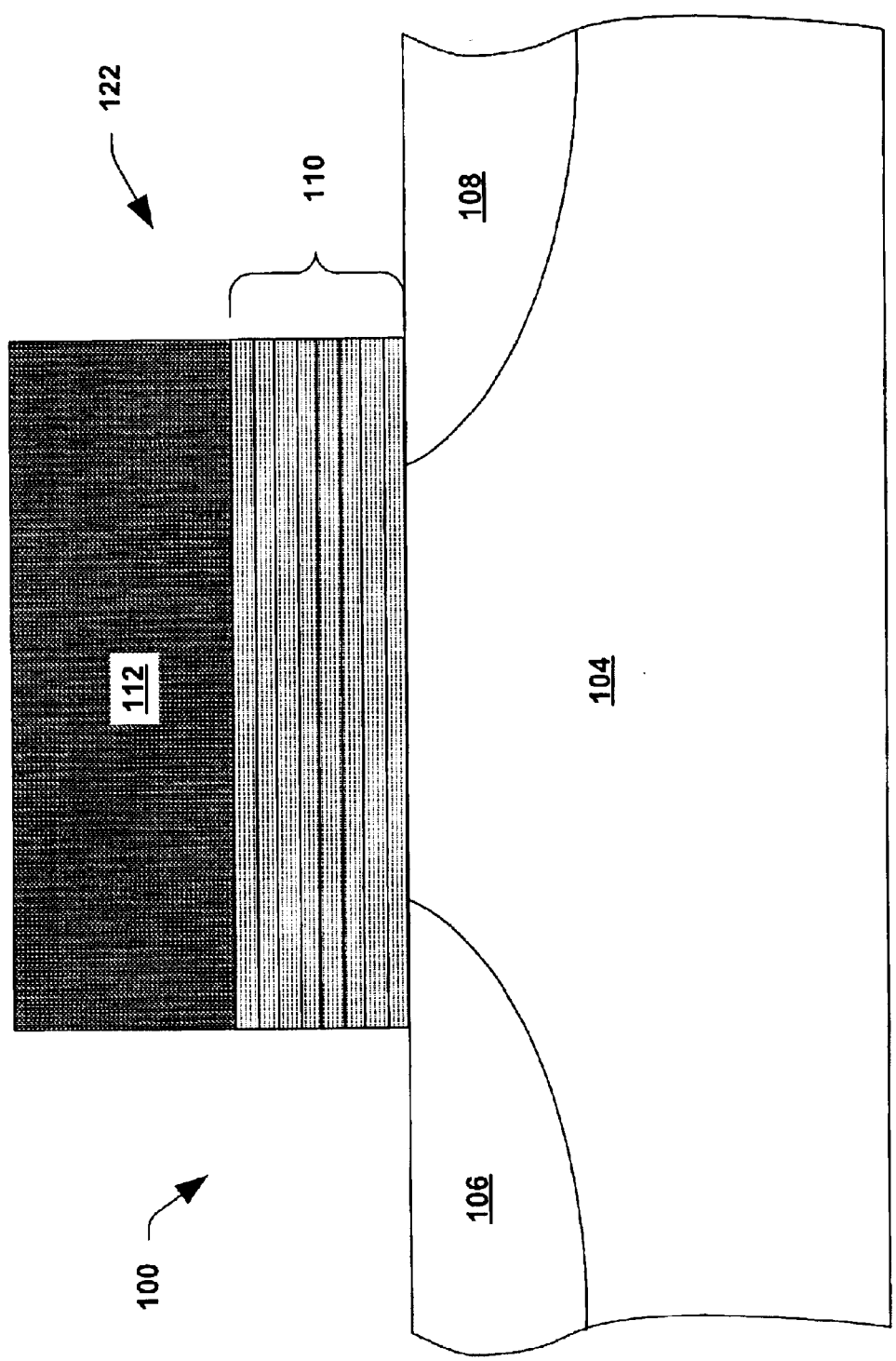
FIG. 1 is a cross sectional view of a semiconductor device in accordance with an aspect of the present invention.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates semiconductor device fabrication by forming dielectric layers having particular relative composition profiles. Dielectric layers are one component of semiconductor devices such as metal oxide semiconductor (MOS) device transistors. Traditionally, silicon dioxide ($SiO_2$) has been employed as the dielectric material for such dielectric layers. However, the dielectric constant for silicon dioxide requires that the dielectric be aggressively scaled to a minimum thickness, which can result in leakage current and tunneling and therefore hampers further size reductions in semiconductor devices. Dielectric compounds that have a higher dielectric constant (e.g., high-k dielectric) can be utilized in place of silicon dioxide and thereby permit semiconductor device dimensions to be reduced.

As dielectric layers become thinner, problems such as leakage current and unwanted diffusion occur. Incorporating nitrogen into the dielectric layer can mitigate the above problems. However, incorporation of nitrogen into the dielectric layers during deposition can create additional problems. For example, incorporating nitrogen into a HfSiO layer during a chemical vapor deposition forming of the layer can result in a low reaction efficiency, possible gas-phase nucleation and particle issues, and carbon is not readily removed. Additionally, incorporation of nitrogen during an atomic layer deposition (ALD) is also problematic because both oxygen and nitrogen containing species would need to be sequentially pulsed. Similarly, incorporation of nitrogen into single layered dielectric layers after deposition can also be problematic. Nitridation techniques can either fail to adequately incorporate nitrogen throughout the dielectric layer, can fail to incorporate nitrogen to a sufficient depth, and/or can cause damage to the dielectric layer itself and/or other nearby layers and structures. Additionally, incorporation of nitrogen into a single layered dielectric layer merely yields a naturally occurring nitrogen incorporation profile, which can be undesirable for some implementations.

The present invention forms a nitrided dielectric layer without substantial harm to a semiconductor layer on which the dielectric layer is formed. The invention employs a multi-stage process in which dielectric sub-layers are individually nitrided before formation of a next dielectric sub-layer. The net result is a nitrided multi-layered dielectric layer comprised of a plurality of dielectric sub-layers in which each of the sub-layers have been individually deposited and incorporated with nitrogen.

Beginning with FIG. 1, a cross sectional view of a semiconductor device 100 in accordance with an aspect of the present invention is depicted. The device 100 includes a drain region 106, a source region 108, a channel region 124, a composite dielectric layer 110, and a gate electrode 112. The dielectric layer 110 is comprised of a nitrogen containing dielectric compound and is a composite of a number of nitrided sub-layers. The dielectric layer 110 can be thin or ultra thin and can also be referred to as a film.

The dielectric layer 110 is formed on a semiconductor layer 104 such as a semiconductor substrate, epitaxial layer or the like. The semiconductor layer 104 can be undoped or doped so as to have n-type or p-type conductivity. The gate electrode 112 is comprised of a conductive material, such as metal or polysilicon, and is formed on the dielectric layer 110. The source region 106 and the drain region 108 are formed within the semiconductor layer 104 by a suitable process such as, for example, after patterning the dielectric layer 110 and the gate electrode 112, therein defining a gate stack 122.

The dielectric layer 110, as previously stated, is comprised of a high-k dielectric material and nitrogen, is a composite of a number of sub-layers, and has a particular composition (e.g., dielectric compound). The sub-layers, and therefore the dielectric layer 110, are comprised of a dielectric compound represented by the formula, $M1_xM2_yO_zN_w$, where M1 and M2 are chosen from the list of elements comprising Hf, Zr, La, Gd, Pr, Ce, Si, Al, Y, and the like. The O component ratio can be adjusted as desired for a given implementation. The N component ratio is greater than zero and can be adjusted as desired throughout the dielectric layer. The dielectric compound has an overall dielectric constant at or between the dielectric constants of the $M1O_{z'}N_{w'}$ and $M2O_{z''}N_{w''}$ materials. Such dielectric compounds can yield dielectric layers with a higher dielectric constant than $SiO_2$. Additionally, high-k dielectric compounds also reduce leakage current by providing a greater physical thickness than $SiO_2$ for a desired electrical oxide thickness (EOT). Some exemplary dielectric compounds are HfSiON, ZrSiON and the like.

The individual sub-layers are formed via a chemical vapor deposition process with a first precursor and a second precursor, however other suitable deposition procedures may be employed. The first precursor contains at least M1 and the second precursor contains at least M2. The chemical vapor deposition process involves placing a wafer containing the device 100 into a chamber and flowing the first precursor and the second precursor into the chamber at respective flow rates. The precursors (e.g., tetrakis dimethylamido silicon (TDMAS) and tetrakis diethylamido hafnium (TDEAH)) are introduced into the chamber and mixed to form a vapor containing desired atoms and/or molecules that are components of the dielectric compound. The desired atoms and/or molecules from the vapor deposit on the wafer surface, and thereby the semiconductor layer 104 surface over a period of time, thereby forming a sub-layer of the dielectric layer 110. As stated above, other suitable deposition techniques can be utilized. Some exemplary techniques that can be employed in addition to chemical vapor deposition includes atomic layer deposition (ALD), physical vapor deposition (PVD), and the like.

Subsequent to the deposition of each of the number of sub-layers, nitrogen is incorporated into the deposited sub-layer via a suitable nitridation process. One suitable nitridation process is an anneal process utilizing ammonia ($NH_3$), nitric oxide (NO) or nitrous oxide ($N_2O$) as a nitrogen source. The anneal process can be performed at a high or low temperature procedure depending on the implementation. Another suitable process is a plasma based nitridation process that incorporates nitrogen directly with a nitrogen or ammonia source, remotely with a nitrogen or ammonia source and/or remotely with a radical nitrogen source.

Some exemplary thicknesses for the sub-layers are about 2 mono-layers or less, about 6–8 Angstroms, or preferably about 3–5 Angstroms. An exemplary total thickness for the dielectric layer 110 is about 15 to 50 Angstroms or, more preferably, about 15 to 30 Angstroms. It is appreciated that other suitable thicknesses for the sub-layers and the dielectric layer are contemplated by the present invention and that the foregoing examples are merely for illustrative purposes.

Figure 2:
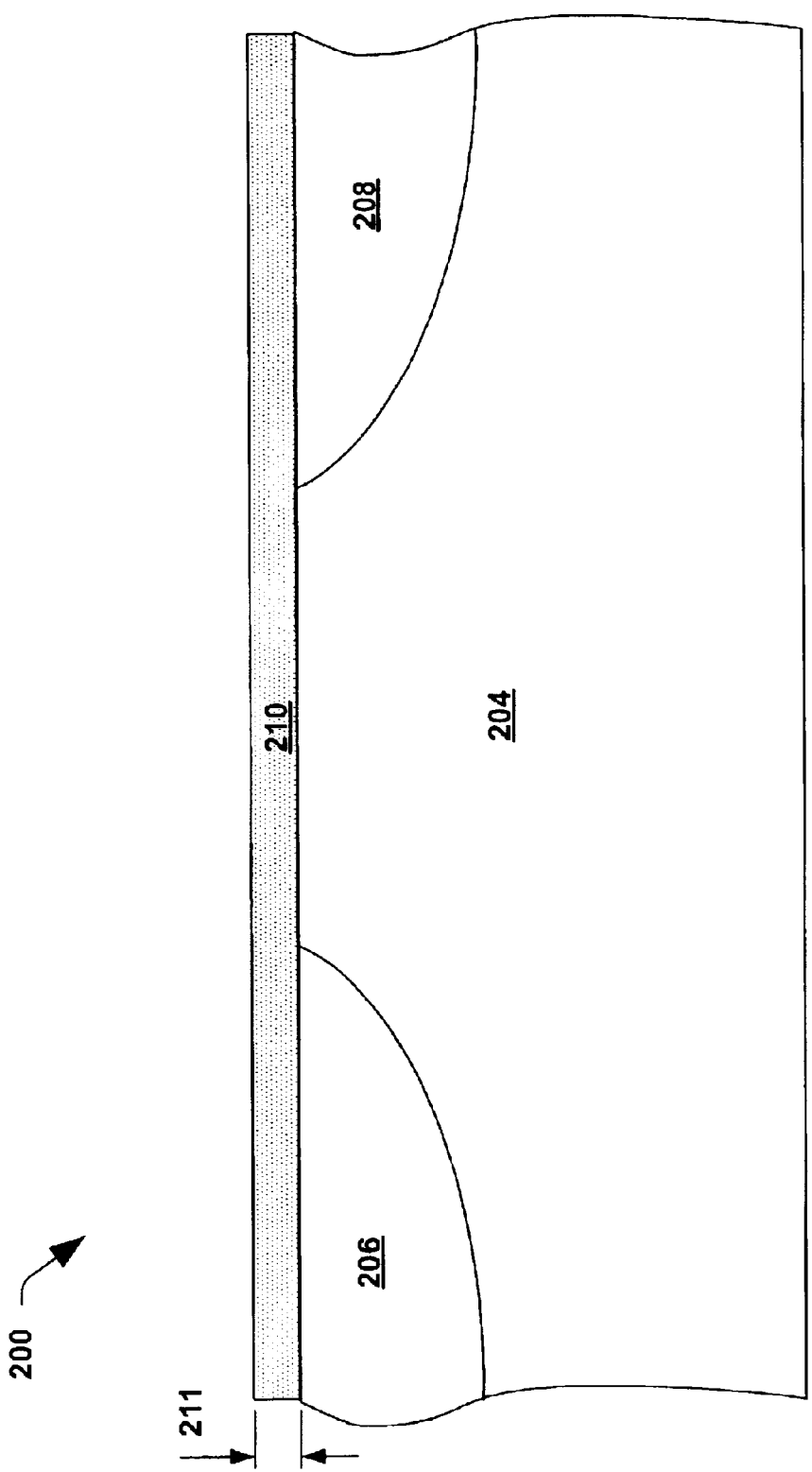
FIG. 2 is a cross sectional view illustrating a stage of fabrication for a semiconductor device in accordance with an aspect of the present invention.

FIG. 2 is a cross sectional view illustrating a stage of fabrication for a semiconductor device 200 in accordance with an aspect of the present invention. The device 200 includes a drain region 206, a source region 208, and a channel region 224. However, the drain region 206 and the source region 208 can be formed/defined at a later stage of fabrication, for example, using a patterned gate electrode to self-align the source and drain regions 206, 208.

A first dielectric sub-layer 210 is deposited and formed on a semiconductor layer 204. The semiconductor layer 204 is comprised of silicon and can be doped so as to be n-type or p-type conductivity. Typically, a deposition process such as chemical vapor deposition is utilized to form the first dielectric sub-layer 210. The first sub-layer 210 has a thickness 211 such that a subsequent nitridation process will not substantially damage the semiconductor layer 204. Some exemplary thicknesses for the first dielectric sub-layer 210 are less than about six mono-layers and more than about four mono-layers. However, it is appreciated that other suitable thicknesses can be employed so long as the subsequent nitridation process is not able or likely to substantially damage the semiconductor layer 204. Thus, a relatively mild subsequent nitridation process could require less thickness whereas a more aggressive subsequent nitridation process could require more thickness.

The first dielectric sub-layer 210 is comprised of a high k dielectric material, such as a dielectric compound according to the following formula: $M1_xM2_yO_z$, where M1 and M2 are chosen from the list of elements comprising Hf, Zr, La, Gd, Pr, Ce, Si, Al, Y, and the like. The O component ratio can be adjusted as desired for a given implementation.

Figure 3:
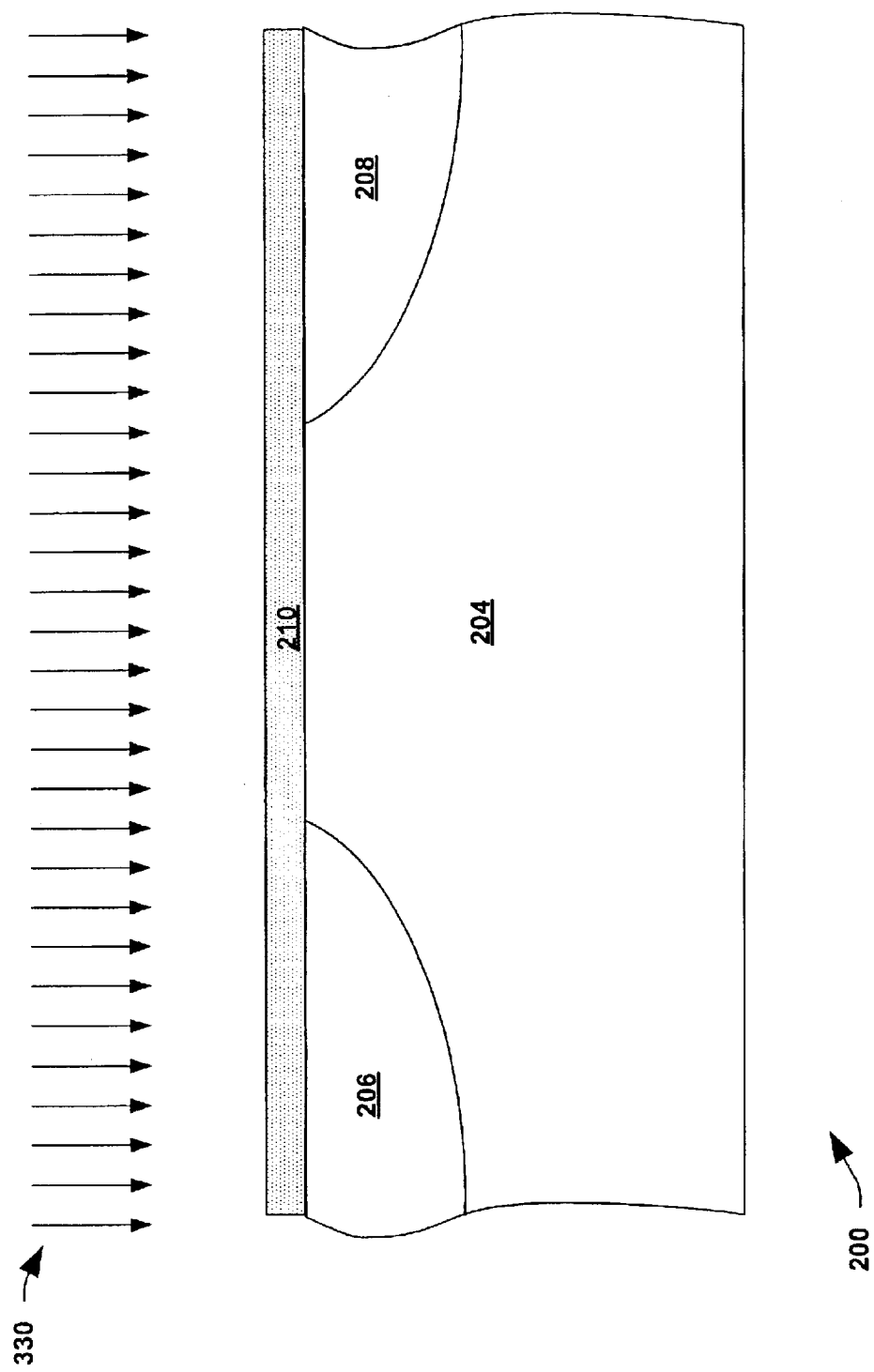
FIG. 3 is a cross sectional view illustrating another stage of fabrication for a semiconductor device in accordance with an aspect of the present invention.

FIG. 3 is a cross sectional view illustrating another stage of fabrication of the semiconductor device 200 in accordance with an aspect of the present invention. At this stage, the first dielectric sub-layer 210 is undergoing a nitridation process 330 in order to incorporate nitrogen into the first dielectric sub-layer. A number of suitable nitrogen incorporating processes can be employed, such as ammonia annealing and/or plasma based processes. However, the nitridation process should be performed in such a way that the semiconductor layer 204 is not substantially damaged. One factor facilitating avoidance of damage to the semiconductor layer 204 is the thickness 211 of the first dielectric sub-layer 210.

One suitable nitridation technique is to perform a thermal anneal with a nitride source such as ammonia, nitric oxide or nitrous oxide. Another suitable technique is to employ remote plasma nitridation. This remote plasma technique is performed by using a microwave chamber placed adjacent to the deposition chamber. The microwave chamber introduces active nitrogen atoms into the deposition chamber. The remote plasma technique has the advantage of not placing the plasma in contact with the device being fabricated 200. Yet another suitable nitridation technique is a decoupled plasma nitridation process, which uses a high density plasma that is introduced into the deposition chamber. The plasma includes a nitrogen source such as ammonia or nitrogen and interacts to incorporate nitrogen into the dielectric compound. Another technique is a slot plane antenna (SPA) plasma based nitridation process. It produces a high density plasma and can be performed at relatively low temperatures (e.g., less than 400 degrees Celsius). The SPA process can reduce the need for a subsequent annealing process because it can cause less damage than other nitridation processes. However, it is appreciated that other suitable nitrogen incorporating techniques can be employed and still be in accordance with the present invention.

Figure 4:
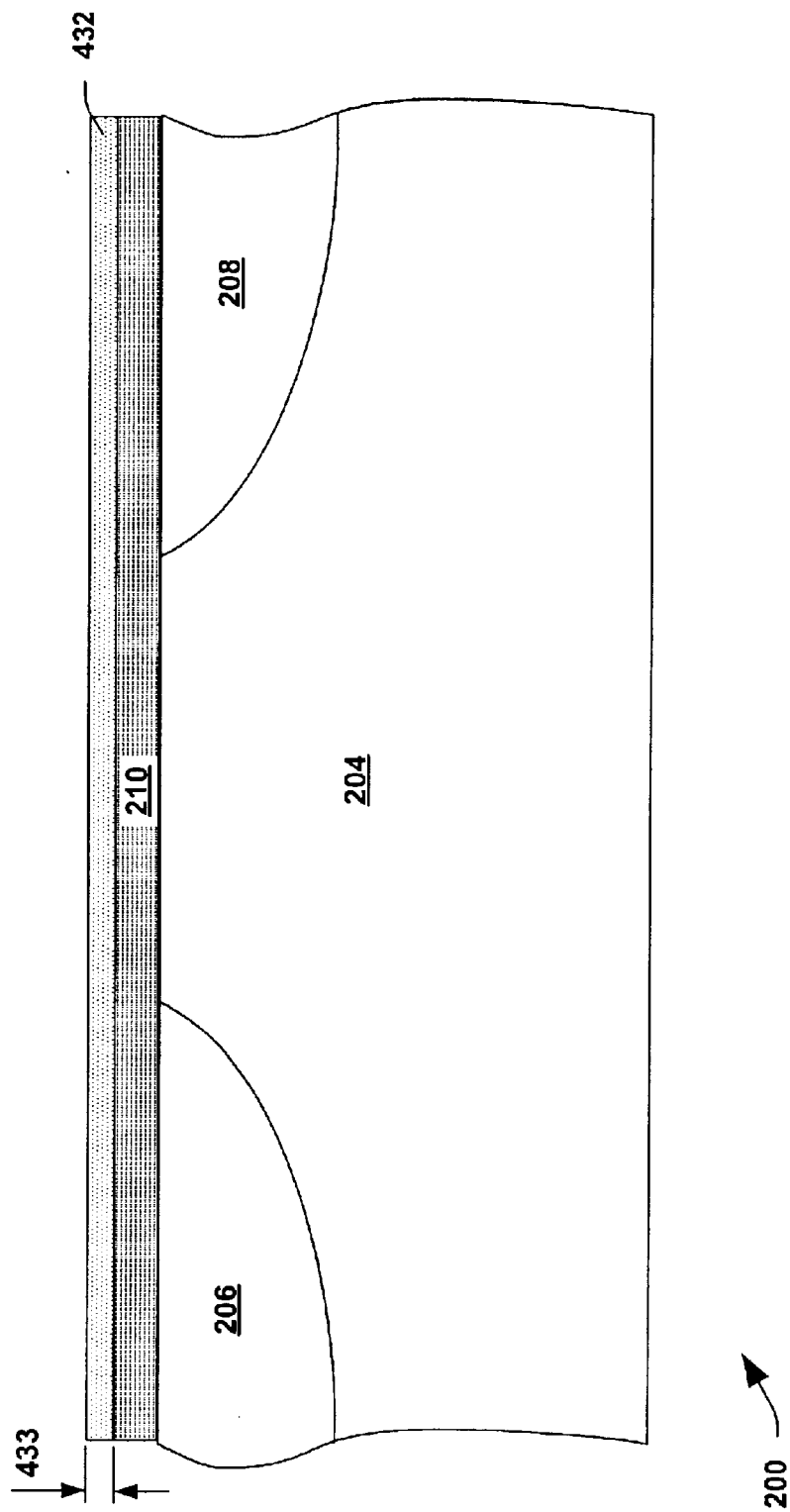
FIG. 4 is a cross sectional view illustrating another stage of fabrication for a semiconductor device in accordance with an aspect of the present invention.

FIG. 4 is a cross sectional view illustrating another stage of fabrication of the semiconductor device 200 in accordance with an aspect of the present invention. At this stage, the first dielectric sub-layer 210 has been successfully nitrided. Now, a second dielectric sub-layer 432 is formed on the first dielectric sub-layer 210 via a similar deposition process. However, the second dielectric sub-layer 432 can have a thickness 433 varied from the thickness 211 of the first dielectric sub-layer 210. For example, the second dielectric sub-layer 432 can be less thick (as is illustrated) than the first dielectric sub-layer 210 so as to permit greater control of the nitrogen content of the second dielectric sub-layer 432 (and subsequently formed dielectric sub-layers). Alternately, the second dielectric sub-layer 432 can be thicker than the first dielectric sub-layer 210 thereby permitting faster formation of a complete dielectric layer. It is appreciated that the thicker the dielectric layer, the more aggressive the nitridation process needed to incorporate nitrogen throughout the sub-layer. A more aggressive nitridation process is one in which the parameters are adjusted so as to incorporate nitrogen to a deeper depth and/or greater concentration. For a thermal anneal based nitridation process, the temperature can be adjusted higher and the amount of a nitrogen source increased in order to yield a more aggressive nitridation process. However, the more aggressive the nitridation process, the more likely that process will damage the formed dielectric layer and/or underlying layers. As an example, a nitridation of a single layered dielectric layer having a thickness of about 50 Angstroms can only be incorporated with nitrogen to a depth of about 25 Angstroms without significantly damaging the single layered dielectric layer and/or other underlying or nearby layers.

Figure 5:
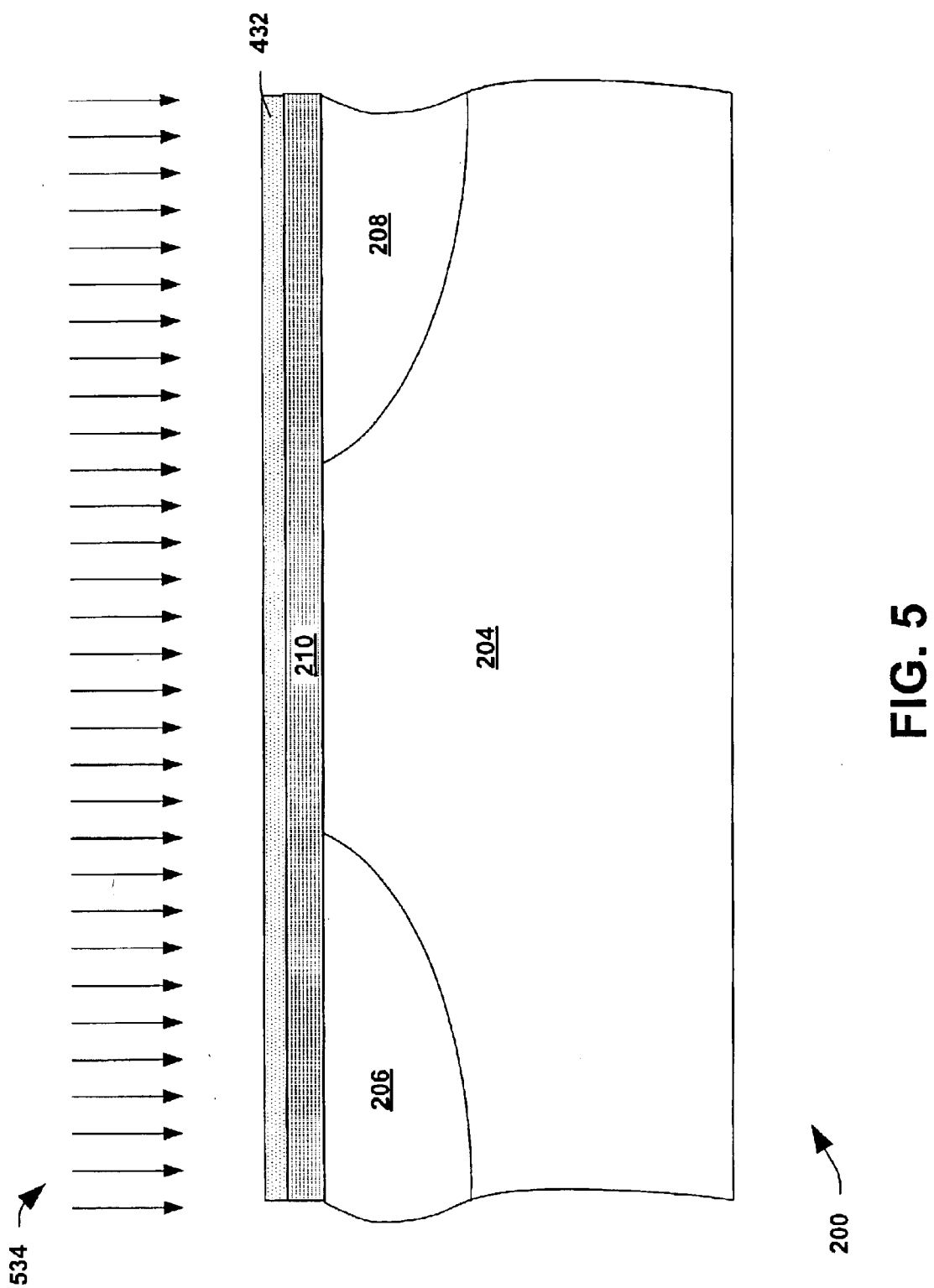
FIG. 5 is a cross sectional view illustrating a stage of fabrication for a semiconductor device in accordance with an aspect of the present invention.

Continuing on with FIG. 5, another cross sectional view of the semiconductor device 200 at a stage of fabrication in accordance with an aspect of the present invention is illustrated. At this stage, the second dielectric sub-layer 432 is undergoing a nitridation process 534 in order to incorporate nitrogen into the second dielectric sub-layer 432. As with the nitridation of the first dielectric sub-layer 210, a number of suitable nitrogen incorporating processes can be employed, such as ammonia annealing and/or plasma operations. However, the nitridation process can be more aggressive than the process employed to nitride the first dielectric sub-layer 210 because the semiconductor layer is farther away.

Figure 6:
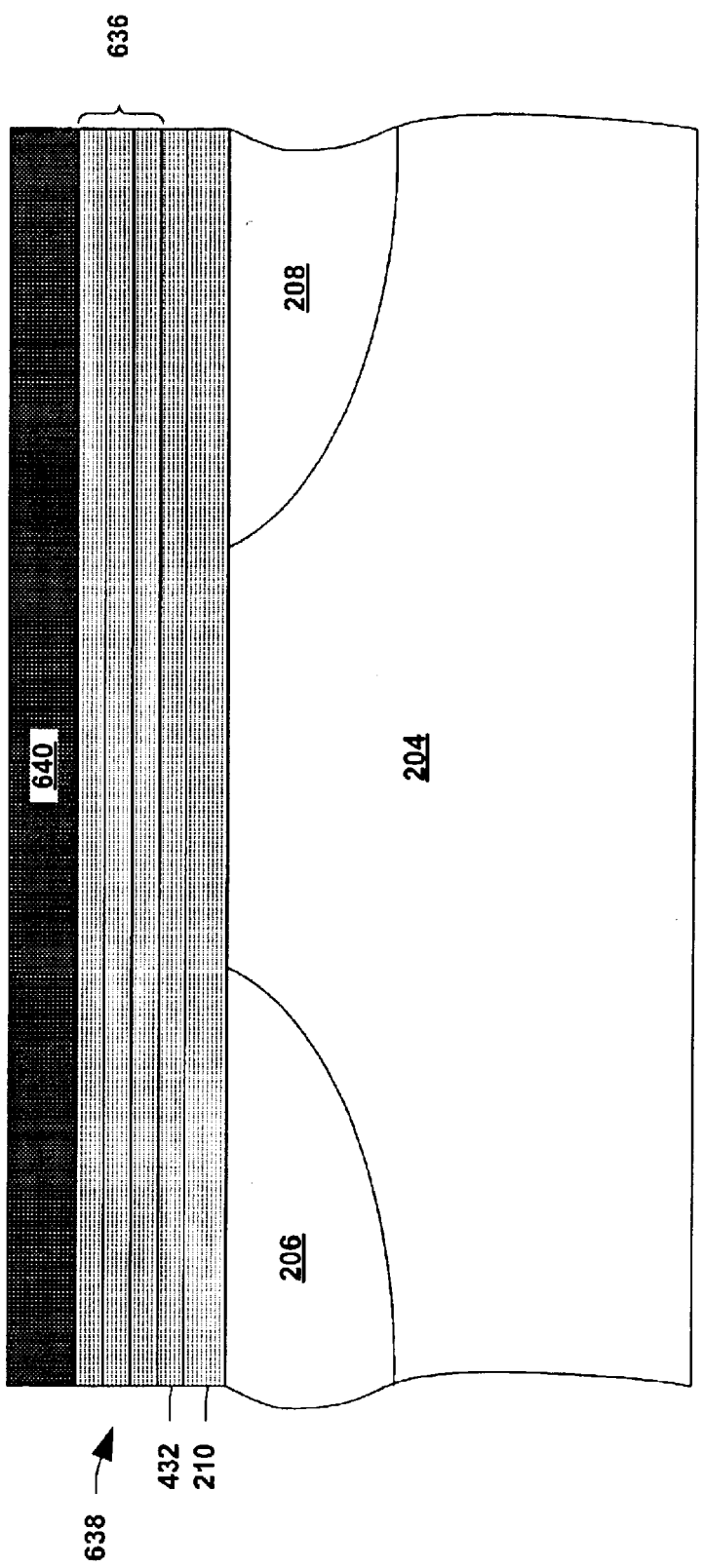
FIG. 6 is a cross sectional view illustrating another stage of fabrication for a semiconductor device in accordance with an aspect of the present invention.

FIG. 6 is another cross sectional view of the semiconductor device 200 at a stage of fabrication in accordance with an aspect of the present invention. Additional dielectric sub-layers 636 have been formed and nitrided in a similar fashion to that of the second dielectric sub-layer 432. However, formation of the dielectric sub-layers 636 can vary from the formation of the first dielectric sub-layer 210, the second dielectric sub-layer 432, and each other and yet still be in accordance with the present invention. The first dielectric sub-layer 210, the second dielectric sub-layer 432, and the additional dielectric sub-layers 636 collectively comprise a nitrided dielectric layer 638. A gate electrode 640, comprised of a conductive material such as metal or polysilicon, is formed on the dielectric layer 638 via a suitable deposition process, for example, chemical vapor deposition or physical vapor deposition.

Figure 7:
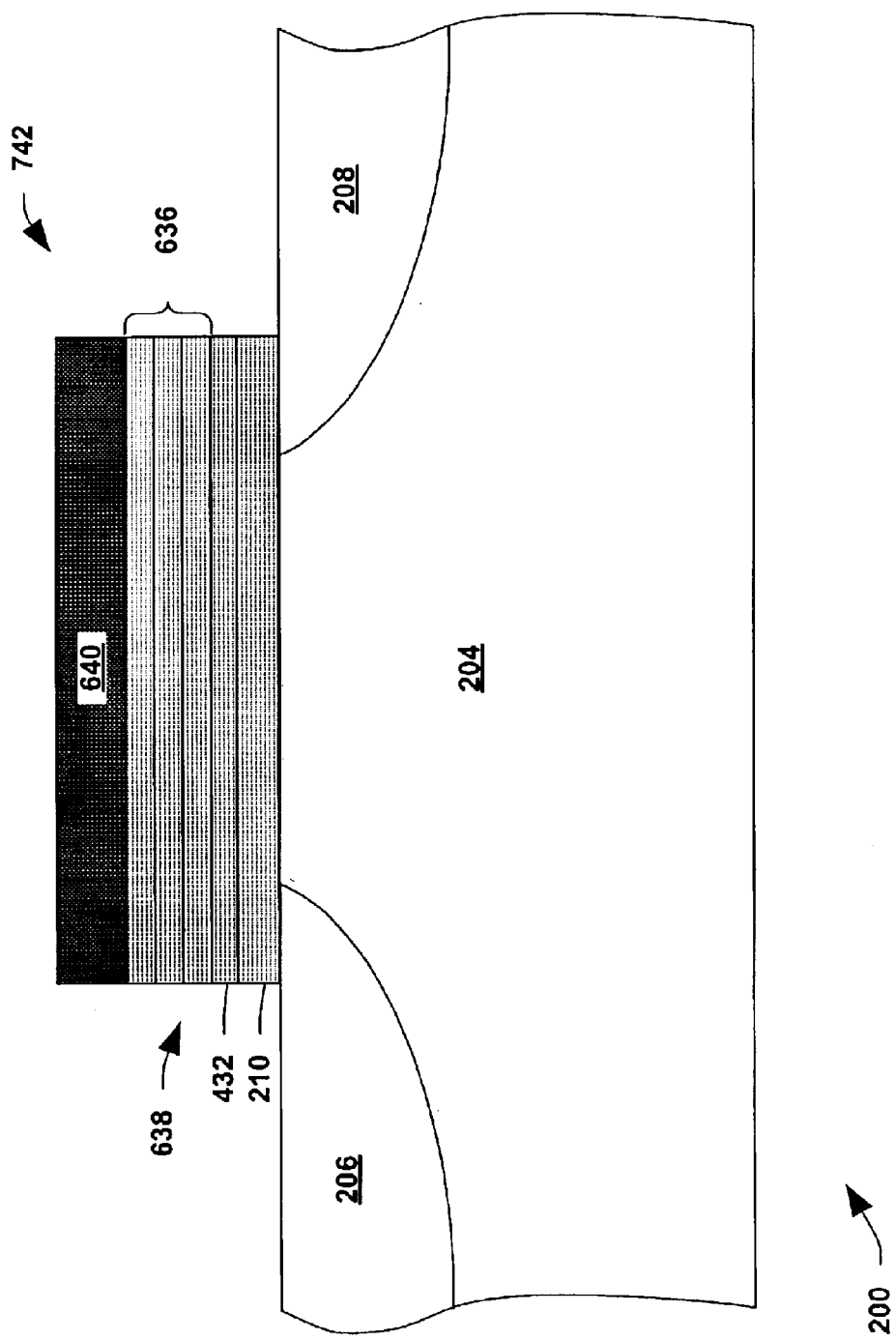
FIG. 7 is a cross sectional view illustrating a stage of fabrication for a semiconductor device in accordance with an aspect of the present invention.

FIG. 7 is a cross sectional view of the semiconductor device 200 at another stage of fabrication in accordance with an aspect of the present invention. Here, the dielectric layer 638 and the gate electrode 640 have been patterned therein defining a gate stack 742. The dielectric layer 638 has a generally uniform nitrogen profile throughout the layer. Because of this uniform profile, the gate electrode 640 is at least partially protected from diffusion of dopants into it from underlying layers and is at least partially protected from polysilicon depletion (e.g., diffusion out of the gate electrode 640 into the dielectric layer 638). Similarly, the semiconductor layer 204 and the source and drain regions are at least partially protected against undesired diffusion from above layers. Additionally, the nitrogen component of the dielectric layer 638 also at least partially protects against unwanted crystallization during high temperature processing steps. It is appreciated that the layers and features formed supra can be performed in different orders. For example, the source region and the drain region can, and often are, fabricated after the gate stack 742 has been defined.

Figure 8:
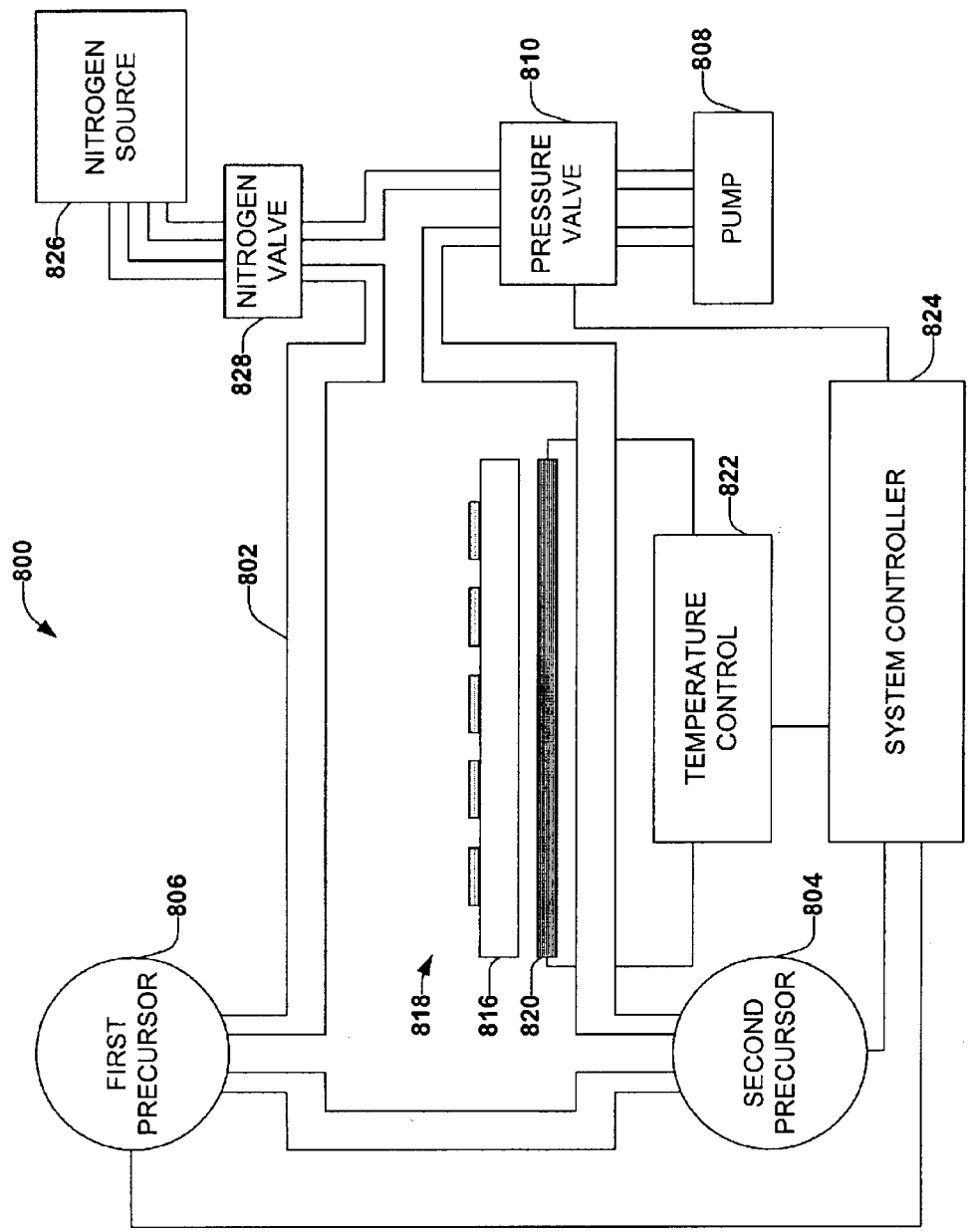
FIG. 8 is block diagram illustrating a control system for forming a nitrided dielectric layer in accordance with an aspect of the present invention.

FIG. 8 is a block diagram of a control system 800 for forming a nitrided dielectric layer in accordance with an aspect of the present invention. The system 800 is able to perform a chemical vapor deposition process and a subsequent nitridation process so as to form the nitrided dielectric layer. The system 800 is able to control/adjust process parameters during the process so as to control a relative ratio of components of a dielectric compound that comprises the dielectric layer throughout the chemical vapor deposition process. The control system 800 includes a chamber 802, a first precursor source 806, a second precursor source 804, a pump 808, a pressure value 810, a wafer pedestal 816, one or more wafers 818, a heating apparatus 820, a temperature control component 822, and a system controller 824. Typically, the wafers will be introduced into the chamber 802 manually or in an automated fashion for processing either serially or in a batch process, as may be desired.

The dielectric layer formed via the system is comprised of a high-k dielectric compound, is a composite of a number of nitrided sub-layers. The sub-layers, and therefore the dielectric layer, are comprised of a dielectric compound represented by the formula, $M1_xM2_yO_zN_w$, where M1 and M2 are chosen from the list of elements comprising Hf, Zr, La, Gd, Pr, Ce, Si, Al, Y, and the like. The O component ratio can be adjusted as desired for a given implementation. The N component ratio is greater than zero and can be adjusted as desired throughout the dielectric layer.

The first precursor 806 yields at least M1 and the second precursor 804 yields at least M2. The chemical vapor deposition process involves placing the one or more wafers 818 into the chamber 802 and flowing the first precursor 806 and the second precursor 804 into the chamber at respective flow rates. The precursors are introduced into the chamber and mixed to form a vapor containing desired atoms and/or molecules, which are components of the dielectric compound. The desired atoms and/or molecules from the vapor deposit on the wafer surface(s) over a period of time, thereby forming a sub-layer of the dielectric layer. However, the nitrogen is not incorporated into the sub-layer as part of the deposition process.

For the chemical vapor deposition phase, the system controller 824 controls flow rates of the first precursor 806 and the second precursor 804 and is able to appropriately adjust the flow rates throughout the chemical vapor deposition process. Additionally, the system controller 824 also communicates with the temperature control unit 822, which in turn is operative to monitor and adjust the heating apparatus to cause the chamber to be at a desired or required temperature. Thus, the system controller 824 is able to modify or adjust the temperature of the chamber during the chemical vapor deposition process of forming the dielectric layer. Finally, the system controller 824 also operates and adjusts the pressure value 810. For some implementations, the modification of pressure in the chamber is relatively advantageous for controlling the relative composition ratio and therefore the particular profile of the dielectric layer as compared with modification of other processing parameters.

For the nitridation phase, the system controller 824 controls the amount of nitrogen source 826 introduced into the chamber via the nitrogen valve 828. The system controller 824 performs a nitridation process on the previously formed dielectric sub-layer so as to incorporate a specific amount of nitrogen into the dielectric layer. An anneal or plasma based nitridation process can be employed to introduce the nitrogen and facilitate its incorporation into the dielectric layer. For some such nitridation procedures, a subsequent anneal process can be required to repair damaged caused by the nitridation process. Additional details of various suitable nitridation procedures are described supra and can be performed by the system 800. After the sub-layer is appropriately nitrided, the system 800 then iteratively repeats the deposition and nitridation processes, in order, until a nitrided dielectric layer having a suitable thickness and a substantially uniform nitrogen content is formed.

Additionally, it is appreciated that the system controller 824 can control other processing parameters and aspects of a chemical vapor deposition process. Furthermore, it is also appreciated that the system 800 is provided for illustrative purposes and can include other components and mechanisms aside from those shown.

The system 800 and variations thereof are contemplated as being in accordance with the present invention. The system 800 and variations thereof can be used to perform atmospheric chemical vapor deposition, low-pressure chemical vapor deposition, and plasma-enhanced chemical vapor deposition processes. Plasma-enhanced chemical vapor deposition is an energy enhanced deposition method in which plasma energy is added to the thermal energy.

Figure 9:
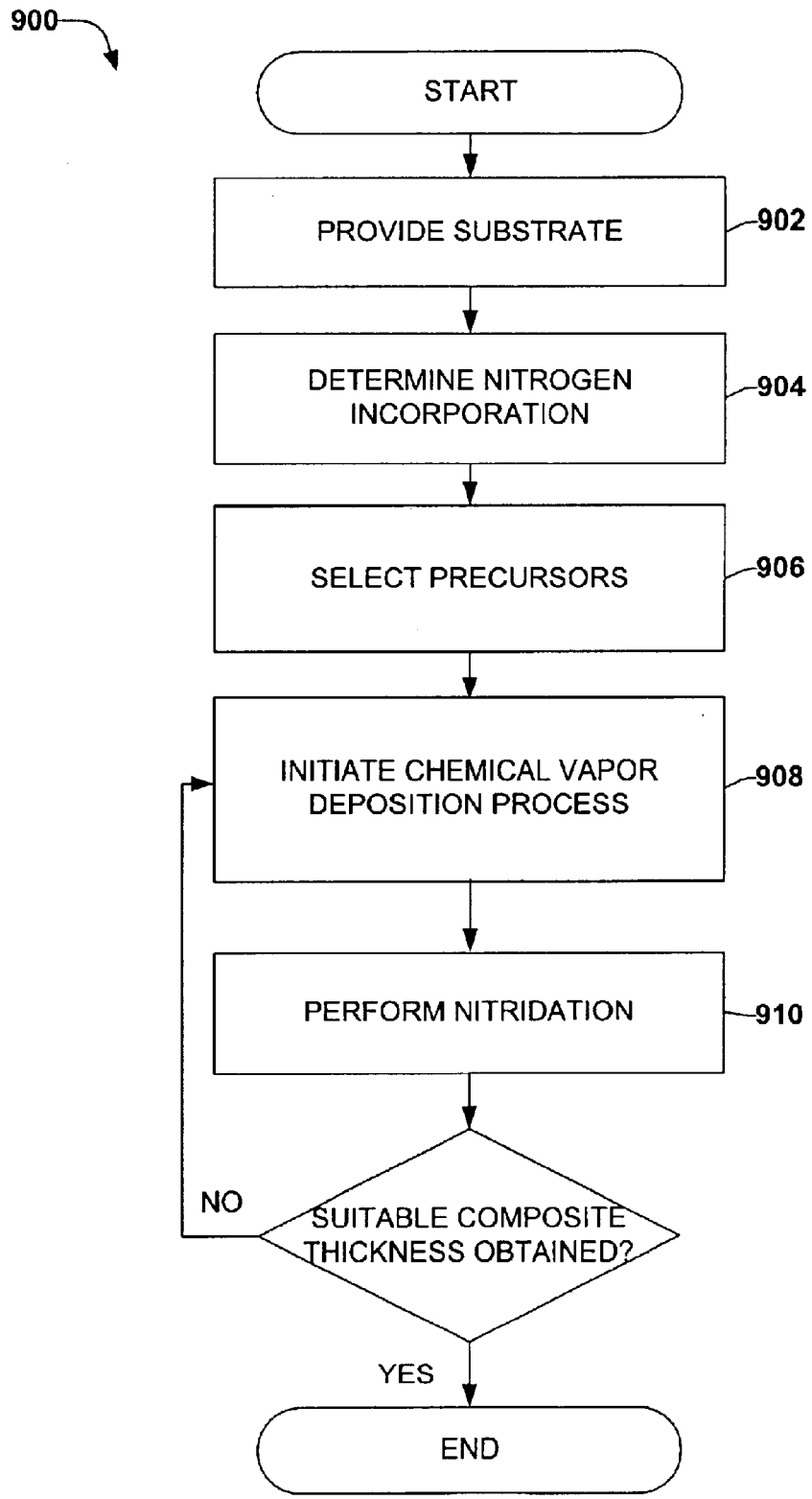
FIG. 9 is a flow diagram illustrating a method for forming a semiconductor device in accordance with an aspect of the present invention.
Figure 10:
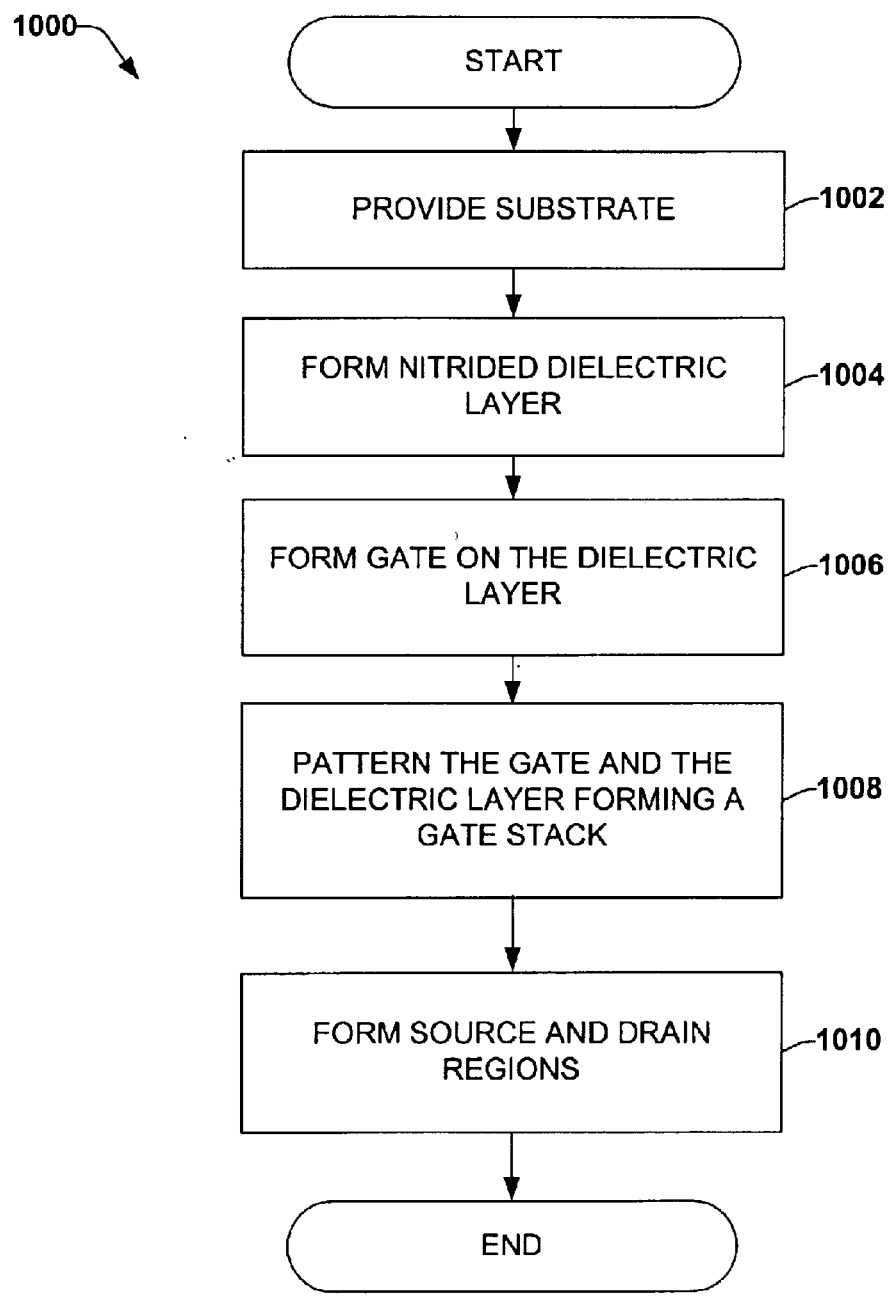
FIG. 10 is a flow diagram illustrating a method for forming a semiconductor device in accordance with an aspect of the present invention.

In view of the foregoing structural and functional features described supra, methodologies in accordance with various aspects of the present invention will be better appreciated with reference to FIGS. 9–10. While, for purposes of simplicity of explanation, the methodologies of FIGS. 9–10 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 9, a flow diagram of a method 900 for forming a nitrided dielectric layer is provided. The dielectric layer formed by the method 900 is a high-k dielectric layer that can be relatively thin or ultra-thin. The method 900 utilizes a chemical vapor deposition process and adjusts process parameters so as to control the relative composition of constituent components throughout the dielectric layer. The dielectric layer formed by the method 900 is comprised of a dielectric compound represented by the formula, $M1_xM2_yO_zN_w$, where M1 and M2 are chosen from the list of elements comprising Hf, Zr, La, Gd, Pr, Ce, Si, Al, Y, and the like. The O component ratio can be adjusted as desired for a given implementation. The N component ratio is greater than zero and can be adjusted as desired throughout the dielectric layer.

A substrate is provided at block 902. The substrate, typically a wafer, is comprised of one or more semiconductor layers and may be doped according to a specific conductivity type. A desired, nitrogen content is determined at block 904. The nitrogen profile can be selected specifically for a given implementation and/or to protect against unwanted diffusion and/or unwanted damage to underlying semiconductor layer. Other characteristics, such as thickness and component composition, can also be selected. Two precursors are selected at block 906, a first precursor for M1 and a second precursor for M2, that at least partially comprise the compound dielectric materials of the dielectric layer (e.g., TDMAS, TDEAH, and the like). Additionally, initial processing parameters, including, but not limited to, wafer temperature, chamber pressure, and precursor flow rates are selected according to an initial portion of the particular profile and/or other characteristics and desired properties.

A chemical vapor deposition process is initiated at block 908 in accordance with the initial processing parameters to form an initial sub-layer. The chemical vapor deposition process can be an atmospheric chemical vapor deposition, a low-pressure chemical vapor deposition, a plasma-enhanced chemical vapor deposition, or a variation thereof. It is appreciated that other deposition processes, such as physical vapor deposition (PVD), atomic layer deposition (ALD), and the like, can be employed instead of the chemical vapor deposition process and still be in accordance with the present invention.

After the initial sub-layer has been formed to a suitable thickness, a nitridation process is performed to incorporate nitrogen into the initial sub-layer in accordance with the desired/selected nitrogen profile 910. A number of suitable nitridation processes can be employed such as annealing, remote plasma, and the like. Blocks 908 and 910 are iteratively repeated until the dielectric layer has been formed to a suitable composite thickness. It is appreciated that subsequent iterations may vary in processing parameters, thickness, composition, nitrogen incorporation, and the like and still be in accordance with the present invention. Additionally, each sub-layer can be formed so as to have a varied or uniform amount of nitrogen incorporated. Thus, the composite dielectric layer can have a varied or uniform nitrogen content profile.

Additional fabrication process can subsequently be performed in order to form additional layers and structures in order to form a semiconductor device with the dielectric layer. However, the dielectric layer, by having a uniform nitrogen content, is at least somewhat protected against unwanted diffusion, leakage current, crystallization, and the like.

FIG. 10 is a flow diagram illustrating a method 1000 of forming a semiconductor device. The method 1000 employs a deposition process that forms a dielectric layer having varied or uniform nitrogen content.

The method 1000 begins at block 1002 wherein a substrate is provided, and can be un-doped, lightly doped p-type, or lightly doped n-type and is comprised of a semiconductor material such as silicon. A well of p-type or n-type conductivity can be formed within the substrate. A nitrided dielectric layer is formed at block 1004 in a series of discrete and/or continuous steps so as to form the dielectric layer having the desired nitrogen content and desired dielectric properties.

The dielectric layer formed is comprised of a high-k, nitrogen containing dielectric compound and is a composite of a number of sub-layers. Each sub-layer is deposited in discrete or steps and nitrided via a nitridation process, such as an ammonia anneal, remote plasma with an ammonia source, and the like. The sub-layers, and therefore the dielectric layer, are comprised of a dielectric compound represented by the formula, $M1_xM2_yO_zN_w$, where M1 and M2 are chosen from the list of elements comprising Hf, Zr, La, Gd, Pr, Ce, Si, Al, Y, and the like. The O component ratio can be adjusted as desired for a given implementation. The N component ratio is greater than zero and can be adjusted as desired throughout the dielectric layer. Enough sub-layers are formed so as to yield a suitable thickness for the dielectric layer.

A gate electrode is formed on the dielectric layer at block 1006. The gate electrode is comprised of a conductive material such as polysilicon or a metal. Then, the gate electrode and the dielectric layer are patterned at block 1008 to form a gate stack, which comprises the dielectric layer and the gate electrode. Finally, a source region and a drain region are formed within the substrate at block 1010. A channel region is defined within the substrate lying between the source region and the drain region.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor device comprising:

providing a semiconductor layer;

depositing a first high-k dielectric sub-layer on the semiconductor layer using chemical vapor deposition with precursors comprising tetrakis dimethylamido silicon and tetraksi diethylamido hafnium;

nitriding the first high-k dielectric sub-layer with a first process without substantially damaging the semiconductor layer;

forming a second high-k dielectric sub-layer on the first high-k dielectric sub-layer using chemical vapor deposition with precursors comprising tetrakis dimethylamido silicon and tetraksi diethylamido hafnium; and nitriding the second high-k dielectric sub-layer with a second process;

wherein said first and second processes are distinct.

2. The method of claim 1, wherein nitriding is performed via a thermal anneal process employing a nitrogen source selected from the group comprising ammonia, nitric oxide, and nitrous oxide.

3. The method of claim 1, wherein nitriding is performed via a remote plasma process.

4. The method of claim 1, wherein nitriding is performed via a decoupled plasma nitridation process.

5. The method of claim 1, wherein wherein the first high-k dielectric layer and the second high-k dielectric layer are individually less than about five mono-layers in thickness.

6. The method of claim 1, further comprising:
depositing additional high-k dielectric sub-layers; and
individiually nitriding the additional high-k dielectric sub-layers.

7. The method of claim 1, further comprising forming a gate electrode on the high-k dielectric layer.

8. The method of claim 7, further comprising:
patterning the gate electrode and the high-k dielectric layers therein defining a gate stack;
forming a source region within the semiconductor layer;
forming a drain region within the semiconductor layer; and
defining a channel region therebetween the source region and the drain region.

9. The method of claim 1, wherein the first high-k dielectric sub-layer has a thickness such that damage to the semiconductor layer by the nitridation of the first high-k dielectric sub-layer is mitigated.

10. A method of fabricating a semiconductor device comprising:
forming a plurality of dielectric sub-layers comprised of a dielectric compound, wherein the plurality of dielectric sub-layers collectively define a dielectric layer;
individually nitriding the plurality of dielectric sub-layers before forming a next sub-layer of the plurality of dielectric sub-layers;
forming a gate electrode on the dielectric layer;
patterning the gate electrode and the dielectric layer therein defining a gate stack; and
forming a source region and a drain region within the substrate.

11. The method of claim 10, wherein the plurality of dielectric sub-layers are nitrided such that the dielectric layer has uniform nitrogen composition.

12. The method of claim 10, wherein the plurality of dielectric sub-layers are nitrided such that the dielectric layer has varying nitrogen composition.

13. A method of fabricating a semiconductor device comprising:
selecting a desired nitrogen composition for a dielectric layer; and
initiating a chemical vapor deposition process utilizing a first precursor and a second precursor to form a nitrided composite dielectric layer by iteratively perform the following:
forming a dielectric sub-layer over a semiconductor layer; and
nitriding the dielectric sub-layer with a nitrogen source.

14. The method of claim 13, wherein the composite dielectric layer formed is comprised of HfSiON.

* * * * *